United States Patent
Chaware et al.

(10) Patent No.: US 9,698,742 B2
(45) Date of Patent: Jul. 4, 2017

(54) ELECTRONIC AMPLIFIER WITH A FEEDBACK CIRCUIT THAT INCLUDES A TRANSCONDUCTANCE AMPLIFIER

(71) Applicant: Allegro Microsystems, LLC, Worcester, MA (US)

(72) Inventors: Virag V. Chaware, Nashua, NH (US); Stephen Marshall, Manchester, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 0 days.

(21) Appl. No.: 14/876,210

(22) Filed: Oct. 6, 2015

(65) Prior Publication Data
US 2017/0099037 A1 Apr. 6, 2017

(51) Int. Cl.
*H03F 1/34* (2006.01)
*H03F 3/45* (2006.01)

(52) U.S. Cl.
CPC ............... *H03F 3/45179* (2013.01); *H03F 2203/45116* (2013.01); *H03F 2203/45118* (2013.01)

(58) Field of Classification Search
CPC .......................................... H03F 1/34
USPC .......................... 330/85, 279, 293
See application file for complete search history.

(56) References Cited

U.S. PATENT DOCUMENTS

| 5,345,191 A * | 9/1994 | Tanaka ............... H03F 1/483 330/277 |
| 8,390,374 B2 * | 3/2013 | Alexander .......... H03F 3/45475 330/147 |
| 8,542,010 B2 | 9/2013 | Cesaretti et al. |
| 9,300,259 B2 * | 3/2016 | Frohlich ............... H03F 1/34 |
| 2004/0012440 A1 * | 1/2004 | Hughes ................ H04R 3/00 330/85 |
| 2006/0097782 A1 * | 5/2006 | Ebner ................. H03F 3/45 330/85 |

OTHER PUBLICATIONS

U.S. Appl. No. 13/766,341, filed Feb. 13, 2013, Romero et al.
Allegro MicroSystems, LLC, "Automotive Grade, Galvanically Isolated Current Sensor IC with Common Mode Field Rejection in a Small Footprint SOIC8 Package;" ACS724; Dec. 1, 2013; 20 Pages.
Allegro MicroSystems, LLC, "High Precision Programmable Linear Hall Effect Sensor IC with EEPROM Analog Output, and Advanced Outpit Linearization;" A1340; Nov. 1, 2012; 42 Pages.
Allegro MicroSystems, LLC, "High Precision, Highly Programmable Linear Hall Effect Sensor IC with EEPROM, Output Protocols SENT and PWM, and Advanced Output Linearization;" A1343; Final Datasheet; Mar. 1, 2013; 54 Pages.

* cited by examiner

*Primary Examiner* — Henry Choe
(74) *Attorney, Agent, or Firm* — Daly, Crowley, Mofford & Durkee, LLP

(57) ABSTRACT

An electronic amplifier has a feedback circuit with a transconductance amplifier.

27 Claims, 10 Drawing Sheets

ELECTRONIC AMPLIFIER WITH A FEEDBACK CIRCUIT THAT INCLUDES A TRANSCONDUCTANCE AMPLIFIER

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to electronic amplifiers and, more particularly, to an electronic amplifier that has a particular feedback arrangement that uses a transconductance amplifier to reduce changes of closed loop gain.

BACKGROUND

Open loop and closed loop amplifiers are known. It is generally known that a feedback circuit (i.e., feedback loop) surrounding an amplifier (i.e., surrounding an otherwise an open loop amplifier) can be used to set a gain of a resulting closed loop amplifier to a desired closed loop gain determined by a few passive circuit components, for example, a few resistors. Closed loop amplifier arrangements, compared with open loop amplifiers, tend to have less change of gain (i.e., closed loop gain) due to a variety of undesirable changes and variations, for example, changes in temperature and unit to unit variations.

Some closed loop amplifiers have one or more passive circuit components (e.g., resistors) within a feedback circuit. Some other closed loop amplifiers have one or more active circuit components within a feedback circuit. In those arrangements that use and active circuit component in a feedback loop, a gain of the resulting closed loop amplifier can be, at least in part, dependent upon a characteristic of the one or more active circuit components, for example, a resistance of the one or more active circuit components. It is known that some active circuit components have a resistance that varies with a power supply voltage used to power the one or more active circuit components. Thus, the closed loop gain of such a closed loop amplifier can vary with respect to power supply voltage.

In order to counter the undesirable change of closed loop gain with respect power supply voltage, some existing closed loop amplifiers that use one or more active circuit components within the feedback circuit use a regulated power supply to power the one or more active circuit components.

A voltage regulator tends to take up silicon real estate and increase integrated circuit cost, and is therefore undesirable. A voltage regulator also tends to consume power.

It would be desirable to provide a closed loop amplifier that has one or more active circuit components in a feedback circuit and that has a reduced undesirable change of closed loop gain, that can result, for example, from an undesirable change of resistance of the one or more active circuit components with respect to a power supply voltage used to power the one or more active circuit components.

In some arrangements, it would also be desirable to provide a circuit that can achieve a stable and consistent ratiometry between two circuit characteristics.

SUMMARY

The present invention provides a closed loop amplifier that has one or more active circuit components in a feedback circuit that has a reduced undesirable change of closed loop gain, that can result, for example, from an undesirable change of resistance of the one or more active circuit components with respect to a power supply voltage used to power the one or more active circuit components.

In some embodiments, the present invention can also provide a circuit that can achieve a known, and/or stable, and/or consistent ratiometry between two circuit characteristics.

In accordance with an example useful for understanding an aspect of the present invention, an electronic amplifier circuit can include a voltage amplifier having a first input node and a voltage output node, wherein the first input node of the voltage amplifier is coupled to a first summing node, wherein the first summing node is coupled to receive a first input current signal. The electronic amplifier circuit can also include a feedback circuit having an input node and a first output node. The feedback circuit can include a sensing circuit having an input node and an output node, wherein the input node of the sensing circuit, the input node of the feedback circuit, and the output node of the voltage amplifier are coupled together. The feedback circuit can also include a first transconductance amplifier having an input node and a first output node, wherein the output node of the sensing circuit is coupled to the input node of the first transconductance amplifier, wherein the first output node of the first transconductance amplifier, the first output node of the feedback circuit, and the first input node of the voltage amplifier are coupled together at the first summing node, wherein the first transconductance amplifier is operable to generate a first feedback current signal at the first summing node, wherein the first feedback current signal and the first input current signal are coupled together at the first summing node to provide a sum of the first input current signal and the first feedback current signal at the first summing node.

BRIEF DESCRIPTION OF THE DRAWINGS

The foregoing features of the invention, as well as the invention itself may be more fully understood from the following detailed description of the drawings, in which.

DETAILED DESCRIPTION

Figure 1:
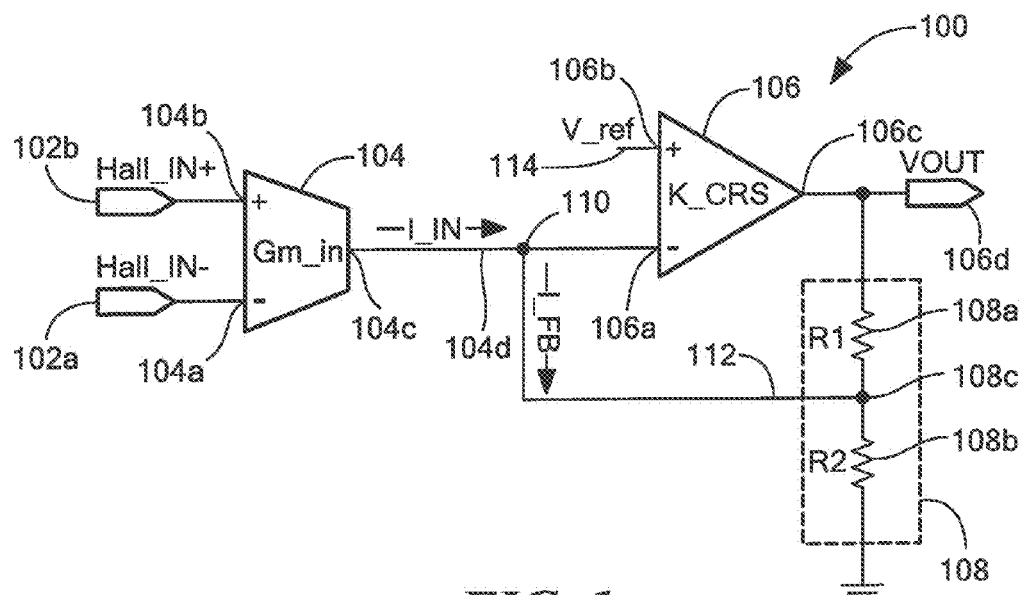
FIG. 1 is a block diagram showing an example of an open loop amplifier coupled to a feedback circuit having passive circuit components, resulting in a prior art closed loop amplifier.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "active electronic component" is used to describe an electronic component that has at least one p-n junction. A transistor, a diode, and a logic gate are examples of active electronic components. In contrast, as used herein, the term "passive electronic component" as used to describe an electronic component that does not have at least one p-n junction. A capacitor and a resistor are examples of passive electronic components.

As used herein, the term "ratiometry" is used to describe a relationship between two characteristics, for example, a relationship between a gain, or a sensitivity, and a power supply voltage. In general, a ratiometry can fail to be consistent, i.e., it may be different with different ones of a plurality of same electronic circuits, or it may change in relation to a third characteristic, for example, temperature. A zero ratiometry implies that a characteristic of the electronic circuit is stable and has no variation with respect to a second characteristic.

As used herein, the term "ratiometric" is used to describe an electronic circuit that has a non-zero ratiometry.

As used herein, the term "ratiometry error" is used to describe an error characteristic associated with a non-zero ratiometry. For example, the ratiometry error can be indicative of a gain or a sensitivity error in an electronic circuit, for example, in a magnetic field sensor, wherein the error changes in response to another (second) characteristic, for example, a power supply voltage, of the electronic circuit. In general, a ratiometry error can fail to be consistent, i.e., it may be different with different ones of a plurality of same electronic circuits, or it may change in relation to a third characteristic, for example, temperature.

Circuits described herein provide a low ratiometry and a low ratiometry error, e.g., a low variation of gain or sensitivity with respect to changes of, or different, power supply voltages, and with little or no variation with respect to a third characteristic. However, other circuits described herein have a predetermined ratiometry error that is more consistent and/or repeatable than prior art circuits.

Referring now to FIG. 1, an electronic amplifier circuit 100 can include a transconductance amplifier 104 having first and second input nodes 104a, 104b, respectively, coupled to a differential voltage input signal 102a, 102b and operable to generate a current signal 104d at an output node 104c. The transconductance amplifier 104 can have a transconductance:

$$G_m = \text{output current/input voltage} = \text{units of mhos}.$$

A voltage amplifier 106 can have an input node 106a and a voltage output node 106c. The input node 106a of the voltage amplifier 106 can be coupled to a summing node 110. A voltage output signal 106d, VOUT, can be generated at the output node 106c of the voltage amplifier 106. The summing node 110 can be coupled to receive the current signal current signal 104d.

The voltage amplifier 106 can have another input node 106b, which can be coupled to a DC reference voltage 114.

The voltage amplifier can be coupled in a closed loop arrangement having a feedback circuit 108, here providing a sensing circuit. The feedback circuit 108 can include a first resistor 108a coupled at one end to the output node 106c of the voltage amplifier 106 and coupled at another end to an end of a second resistor 108b. Another end of the second resistor 108b can be coupled to a reference voltage, for example, a ground.

A junction node 108c between the first and second resistors 108a, 108b, respectively, can be coupled to the summing node 110.

For this and other closed loop circuit described below, it is assumed that an open loop gain of the amplifier 106 is substantially larger than the desired closed loop gain of the closed loop arrangement. It is also assumed that an input impedance at the input node 106a of the voltage amplifier 106 is high (e.g., greater than ten megOhms). It is also assumed that an output impedance at the output node 104c of the transconductance amplifier 104 is high, resulting in the transconductance amplifier 104 being a current source.

It will be understood that the current signal 104d flows as a current signal 112 into the junction node 106c, with very little current flowing to the input node 106a of the voltage amplifier 106. More particularly, for an AC input current signal 104d and/or for a DC current signal 104d, the input current signal 104d and current signal 112 are substantially the same AC and/or DC signal.

In other embodiments, the transconductance amplifier 104 is omitted, and instead, the current signal 104d is generated by a different electronic circuit, for example, a voltage source signal generator (e.g., an operational amplifier) coupled in series with a resistor, which approximates a current source.

A gain (VOUT/$V_{IN}$) of the electronic amplifier circuit 100 can be determined from the following:

$$VOUT = R1 Gm * V_{IN} \quad (1)$$

where:
VOUT=output voltage 106d
R1=resistor 108a
Gm=transconductance of the transconductance amplifier 104
$V_{IN}$=Hall_IN+−Hall_IN−=differential voltage signal 102b-102a Referring now to FIG. 2, in which like elements of FIG. 1 are shown having like reference designations, an electronic amplifier circuit 200 is similar to the electronic amplifier circuit 100 of FIG. 1, but includes a variable resistance 204. The variable resistance 204 (a first characteristic) represents any unwanted resistive element in the circuit that varies with some external parameter (a second characteristic), for example, temperature or power supply voltage.

In some embodiments, the variable resistance 204 is indicative of an active circuit element. In some embodiments, the variable resistance 204 is indicative of a passive circuit element.

The variable resistance 204 can also be representative of a metal circuit trace (e.g., on a circuit die or on a circuit board) or a wire connecting the feedback path. Any conductor has an associated resistance (first characteristic), and this resistance can change with an external parameter (second characteristic) such as temperature or mechanical stress. In practice, these metal routes can be designed to have a low enough resistance that it does not affect the circuit operation, except in very precise applications.

A gain (VOUT/$V_{IN}$) of the electronic amplifier circuit 200 can be determined from the following:

$$VOUT = V_{IN} * Gm * (R1 + Rv * (1 + (R1/R2))) \quad (2)$$

where:
VOUT=output voltage 106d
R1=resistor 108a
R2=resistor 108b
Rv=variable resistance 204
Gm=transconductance of the transconductance amplifier 104
$V_{IN}$=Hall_IN+−Hall_IN−=differential voltage signal 102b-102a From equation (2) it should be apparent that changes of the variable resistance 204 affect the gain of the electronic amplifier circuit, which is undesirable.

In operation, as the variable resistance 204 changes undesirably, the currents 104d and 112 (AC components and DC components) remain equal and at original values, but AC and DC voltages at the summing node 110 vary in accordance with the variations of the variable resistance 204 due to variations in a voltage across the variable resistance 204. Thus, gain of the electronic amplifier circuit 200 can vary undesirably.

In other words, the current 112 flowing across the resistance 204 creates a difference in potential between nodes 110 and 108c. This difference in potential can vary as the resistance 204 varies undesirably. Since the amplifier 106 is operating in a closed-loop feedback arrangement, it must provide a higher output voltage 206 to maintain the current signal 112 equal to the current signal 104d. This undesirable change in the resistance 206 is proportional to the change in the resistance 204.

Figure 2:
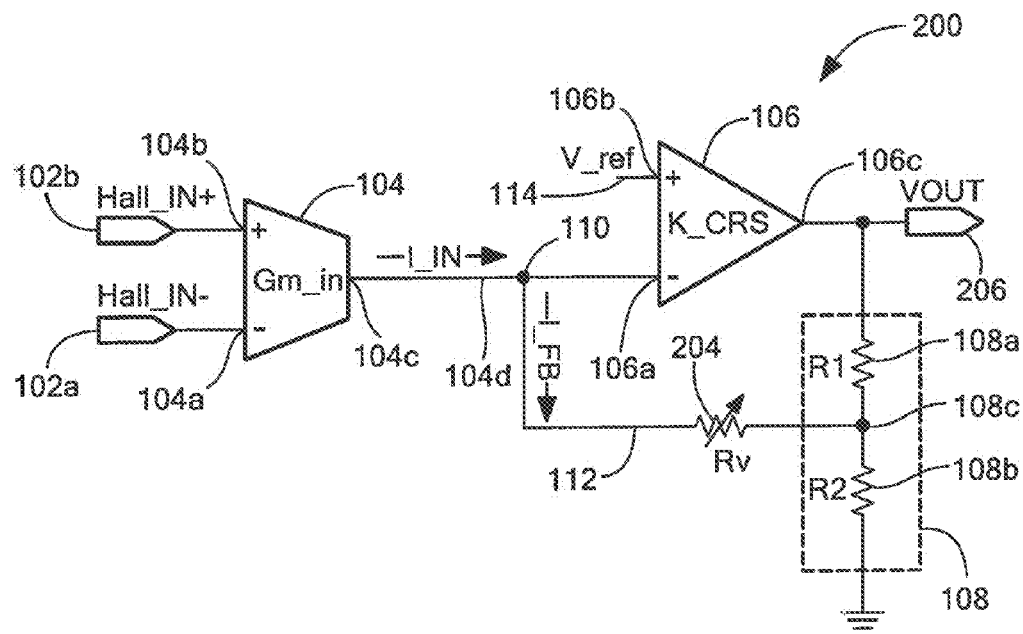
FIG. 2 is a block diagram showing another example of an open loop amplifier but coupled to a feedback circuit having a variable resistor that changes resistance, resulting in another closed loop amplifier.
Figure 3:
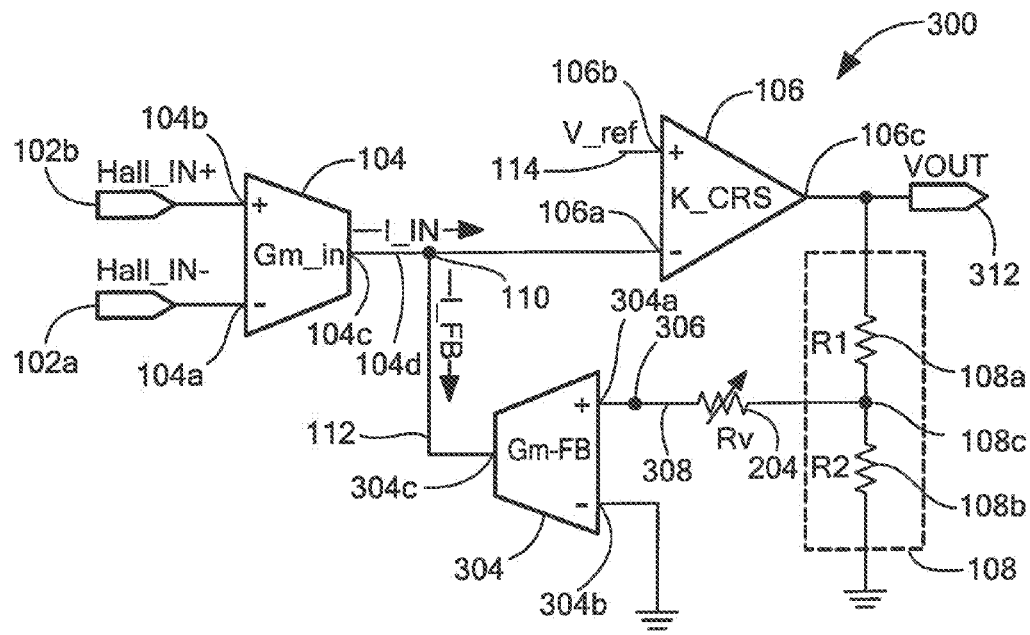
FIG. 3 is a block diagram showing another example of an open loop amplifier coupled to a feedback circuit having a variable resistor that changes resistance, which is coupled in series with a transconductance amplifier, resulting in another closed loop amplifier.

Referring now to FIG. 3, in which like elements of FIGS. 1 and 2 are shown having like reference designations, an electronic amplifier circuit 300 is similar to the electronic amplifier circuits 100, 200 of FIGS. 1 and 2, but includes a transconductance amplifier 304 having an input node 304a and an output node 304c. It is assumed that the input node 304a has a high input impedance and the output node 304c has a high output impedance.

Due to the high input impedance of the input node 304a, a current signal 308 is significantly smaller than the similar current signal 112 of FIG. 2. It can be assumed that the input impedance of the input node 304a is high enough to neglect the current signal 308. Since the current signal 308 is negligibly small, a potential difference across the resistance 204 between nodes 306 and 108c is also negligibly small. Therefore, the variable resistance 204 does not affect the gain of the electronic amplifier circuit 300.

A gain (VOUT/$V_{IN}$) of the electronic amplifier circuit 300 can be determined from the following:

$$VOUT = R1 Gm * V_{IN} \quad (3)$$

where:
VOUT=output voltage 106d
R1=resistor 108a
Gm=transconductance of the transconductance amplifier 104
$V_{IN}$=Hall_IN+−Hall_IN−=differential voltage signal 102b-102a It will be understood that the dependency upon the variation of the variable resistance 204 is removed in the electronic amplifier circuit 300, compared to the electronic amplifier circuit 200 of FIG. 2. Essentially zero current flows through the resistance 204, thereby generating no voltage. Voltage at nodes 306 and 108c are the same.

Figure 4:
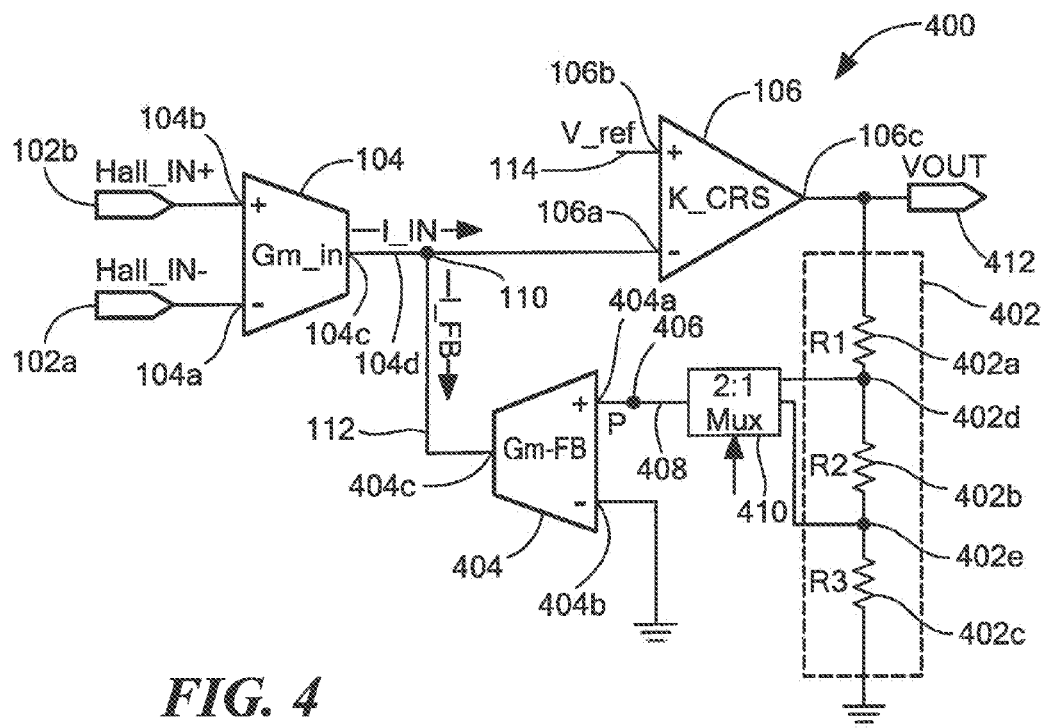
FIG. 4 is a block diagram showing another example of an open loop amplifier coupled to a feedback circuit having an active circuit component that changes resistance, which is coupled in series with a transconductance amplifier, resulting in another closed loop amplifier.

Referring now to FIG. 4, in which like elements of FIGS. 1, 2, and 3 are shown having like reference designations, an electronic amplifier circuit 400 is similar to the electronic amplifier circuits 100, 200, 300 of FIGS. 1, 2, and 3, but the variable resistance 204 has been replaced by a 2:1 active switch (muliplexer) 410.

The 2:1 active switch 410, being an active circuit component, can have a resistance that varies, for example, with respect to a power supply voltage used to power the 2:1 switch.

The current 112 does not pass through the active switch 410. For reasons described above in conjunction with FIG. 3, a current 408 is approximately zero. Therefore, the active switch 410, having changes of resistance, does not affect the gain of the electronic amplifier circuit 400.

Gains of the electronic amplifier circuit 400 are not given here, but are easily computed.

Figure 5:
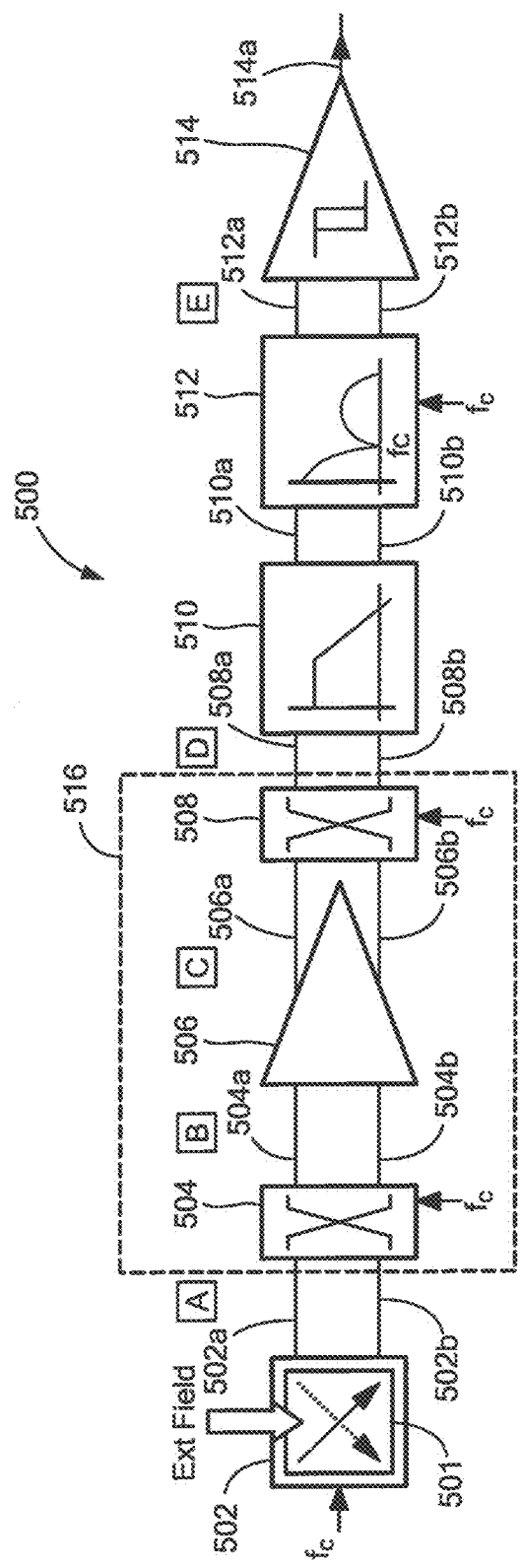
FIG. 5 is a block diagram showing a magnetic field sensor having an electronic amplifier circuit and with Hall effect element used in a prior art four phase current spinning arrangement.

Referring to FIG. 5, a prior art magnetic field sensor 500 includes a Hall effect element 501 coupled within a switching circuit 502. The switching circuit 502 is configured to generate a differential signal 502a, 502b responsive to an external magnetic field. Many signals described below can be differential signals, however, the term differential is not used in all instances. In other embodiments, some or all of the signals are single ended signals.

The switching circuit 502 switches a drive signal (not shown) to the Hall effect element 502 with a clock at a frequency of $f_c$. The switching circuit 502 can generate current spinning (also referred to as chopping), for example, four phase current spinning, described move fully below in conjunction with FIG. 6.

Current spinning will be understood to be an arrangement whereby current is injected, for example, between opposing pairs of four terminals of a Hall effect element in four so-called phases, and differential output signals are generated at each one of the four phases. Current spinning can result in a reduction of DC offset voltage in way described below.

The magnetic field sensor 500 also includes a switching circuit 504 coupled to receive the differential signal 502a, 502b and configured to generate a switched signal 504a, 504b. The switching circuit 504 is also switched with the clock at a frequency of $f_c$.

An amplifier 506 is coupled to receive the switched signal 504a, 504b and configured to generate an amplified signal 506a, 506b. A switching circuit 508 is coupled to receive the amplified signal 506a, 506b and configured to generate a demultiplexed signal 508a, 508b. The switching circuit 508 is clocked with the clock at the frequency, $f_c$. A low pass filter 510 is coupled to receive the demultiplexed signal 508a, 508b and configured to generate a filtered signal 510a, 510b. A sin x/x (sin c) filter 512 is coupled to receive the filtered signal 510a, 510b and configured to generate a filtered signal 512a, 512b. A comparator 514, here a Schmitt trigger 514, can be coupled to receive the filtered signal 512a, 512b and configured to generate a magnetic field sensor output signal 514a. In some embodiments, the comparator 514 is not used.

In some embodiments, the sin c filter 512 is a switched capacitor filter having a first notch at a frequency $f_c$. However, in other embodiments, the sin c filter 512 is generated digitally. In still other embodiments, the sin c filter 512 is an analog unclocked filter.

It will be understood that clock frequency provided to the sin c filter 512 can be at a frequency of $f_c$ as shown to provide the notch at the frequency $f_c$. However, it will also be understood that the sin c filter 512 can be designed to have the notch at the frequency $f_c$ but using a clock signal at a different frequency. In conjunction with figures below (e.g., FIGS. 7-11), the clock provided to the sin c filter 512 is described to be at the frequency $f_c$. However, it is the notch frequency at the frequency $f_c$ that is desired.

It will be understood that the magnetic field sensor output signal 514a is a two state signal and that the magnetic field sensor 500 is a magnetic switch. However, in other embodiments, the comparator 514 is replaced by a linear amplifier or buffer, and the magnetic field output signal is a linear signal. It will also be understood that, in some embodiments, only one of the filters 510, 512 is used.

Operation of the magnetic field sensor of FIG. 5 is described below in conjunction with FIGS. 6-11.

Figure 6:
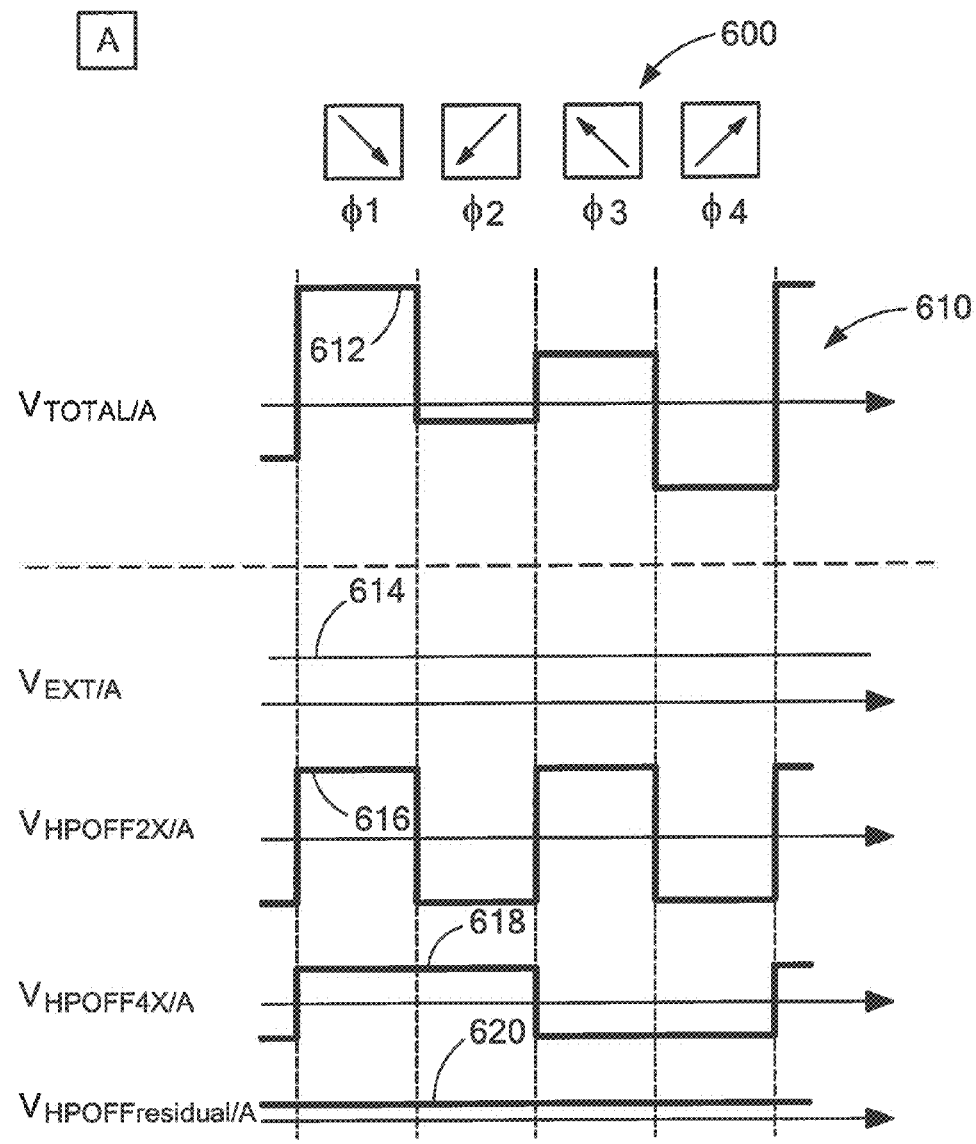
FIG. 6 is series of graphs showing separable time domain signals, which sum together, as generated by the Hall effect element used in a four phase current spinning arrangement of the magnetic field sensor of FIG. 5.

Referring now to FIG. 6, graphs 610 have separate horizontal axes with scales in units of time in arbitrary units and separate vertical axes with sales in units of volts in arbitrary units.

A signal 612 is representative of a signal at box labeled A of FIG. 25, i.e., a signal representative of four phase current spinning, i.e., four phase chopping, of the Hall effect element 501. The four phases are represented by the block diagram 600 of FIG. 6, and are representative of so-called offset modulation.

It is apparent that each phase of the signal 612 has a different undesirable offset signal (DC error signal). The graph 612 is indicative of four phase offset modulation by the switching circuit 502 of FIG. 5.

For purposes of signals shown in other figures below, the time domain signal 612 is broken into four separable time domain signal components 614, 616, 618, 620, which are treated separately in subsequent figures. Thus, the signal 612 is referred to herein as a "composite signal." It will be recognized that the four signal components 614, 616, 618, 620 of FIG. 6 exist simultaneously and sum together, according to superposition, in the composite signal 612 at the box labeled A of FIG. 5.

An external field signal component 614, VEXT/A, is indicative of an external magnetic field sensed by the current sensor 500 of FIG. 5. While the external field signal component 614 is shown to be a DC signal for clarity, the external field signal 614 could equally well be an AC signal.

When summed together, the external field signal component 614, VEXT/A, a first current spinning offset signal component 616, VHPOFF2X, a second current spinning offset signal component 618, VHPOFF4X, and a residual current spinning offset signal component 620, VHPOFFresidual, form the composite signal 612.

It should be noted that the current spinning signal components 616, 618 above occur at different frequencies. If there is a current spinning frequency, Fspin, at which the Hall effect elements 501 of FIG. 5 is sequentially switched in a current spinning arrangement (see, e.g., block diagram 600), then a frequency of the current spinning offset signal component 616 is Fspin, a frequency of the current spinning offset signal component 614 is Fspin/2, and a frequency of the residual current spinning offset signal component 620 is zero or DC. A frequency of the current spinning offset signal 616, Fspin, has a frequency for which changes of state are the same as a rate of change of state of the phases of the current spinning 600.

Figure 7:
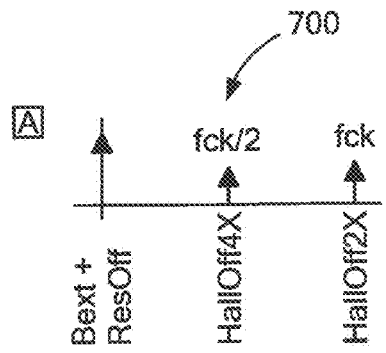
FIGS. 7-11 are graphs showing frequency domain signal at various points in the magnetic field sensor of FIG. 5, and which are also representative of a magnetic field sensor having electronic amplifier circuits below.

Referring now to FIG. 7 with reference to the signals of FIG. 6, a graph 700 has a horizontal axis with a scale in arbitrary units of frequency and a vertical axis with a scale in arbitrary units of magnitude. The graph 700 includes three spectral lines when in the presence of a stationary, i.e. non-varying, magnetic field. The magnetic field is a sensed or external magnetic field.

The graph 700 is representative of the magnetic field signal at a box labeled A of the magnetic field sensor 500 of FIG. 5. The graph 700 is indicative of the above-described four phase offset modulation by the switching circuit 502.

A first spectral line (left) occurs at DC and has a magnitude corresponding to a magnitude, Bext, of the external, or sensed, magnetic field plus an undesirable residual offset voltage (after chopping) generated by the magnetic field sensing element 501 of FIG. 5.

A second spectral line occurs at a frequency of fck/2 and results from the 4× chopping described above.

A third spectral line occurs at a frequency of fck and also results from the 4× chopping described above.

Figure 8:
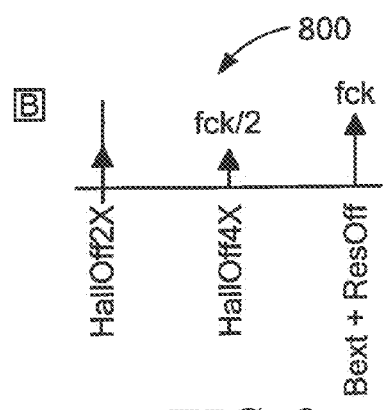

Referring now to FIG. 8 with reference to the signals of FIG. 7, a graph 800 has a horizontal axis with a scale in arbitrary units of frequency and a vertical axis with a scale in arbitrary units of magnitude. The graph 800 includes three spectral lines when in the presence of a stationary, i.e. non-varying, magnetic field. The magnetic field is a sensed or external magnetic field.

The graph 800 is representative of the magnetic field signal at a box labeled B of the magnetic field sensor 500 of FIG. 5.

As can be seen, by operation of the switching circuit 504 of FIG. 5, frequencies have been shifted.

A first spectral line (left) occurs at DC and has a magnitude related to the magnitude of the third spectral line of FIG. 7.

A second spectral line occurs at a frequency of fck/2 and has a magnitude related to the magnitude of the second spectral line of FIG. 7.

A third spectral line occurs at a frequency of fck and has a magnitude related to the magnitude of the first spectral line of FIG. 7, corresponding to the magnitude, Bext, of the external, or sensed, magnetic field plus the undesirable residual offset voltage (after chopping) generated by the magnetic field sensing element 501 of FIG. 5.

Figure 9:
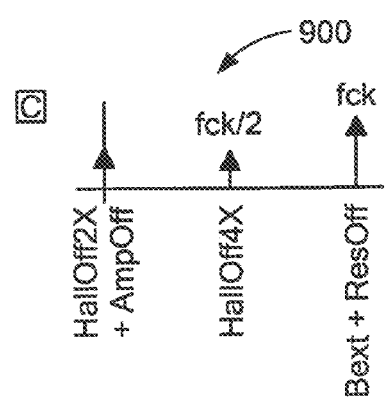

Referring now to FIG. 9 with reference to the signals of FIG. 8, a graph 900 has a horizontal axis with a scale in arbitrary units of frequency and a vertical axis with a scale in arbitrary units of magnitude. The graph 900 includes three spectral lines when in the presence of a stationary, i.e. non-varying, magnetic field. The magnetic field is a sensed or external magnetic field.

The graph 900 is representative of the magnetic field signal at a box labeled C in the magnetic field sensor 500 of FIG. 5.

As can be seen, the amplifier 506 of FIG. 5 adds a DC offset component, AmpOff, to the first spectral line of FIG. 8 appearing at DC. Otherwise, the three spectral lines of FIG. 9 are the same as those of FIG. 8, but scaled according to a gain of the amplifier 506.

Figure 10:
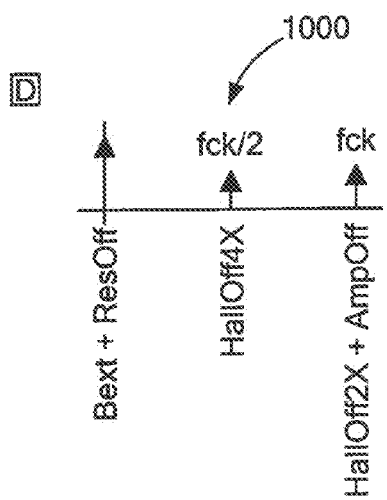

Referring now to FIG. 10 with reference to the signal of FIG. 9, a graph 1000 has a horizontal axis with a scale in arbitrary units of frequency and a vertical axis with a scale in arbitrary units of magnitude. The graph 1000 includes three spectral lines when in the presence of a stationary, i.e. non-varying, magnetic field. The magnetic field is a sensed or external magnetic field.

The graph 1000 is representative of the magnetic field signal at a box labeled D of the magnetic field sensor 500 of FIG. 5.

As can be seen, by operation of the switching circuit 508 of FIG. 5, frequencies have been shifted.

A first spectral line (left) occurs at DC and has a magnitude related to the magnitude of the third spectral line of FIG. 9, corresponding to the magnitude, Bext, of the external, or sensed, magnetic field plus the undesirable residual offset voltage (after chopping) generated by the two magnetic field sensing element 501 of FIG. 5.

A second spectral line occurs at a frequency of fck/2 and has a magnitude related to the magnitude of the second spectral line of FIG. 9.

A third spectral line occurs at a frequency of fck and has a magnitude related to the magnitude of the first spectral line of FIG. 9.

Figure 11:
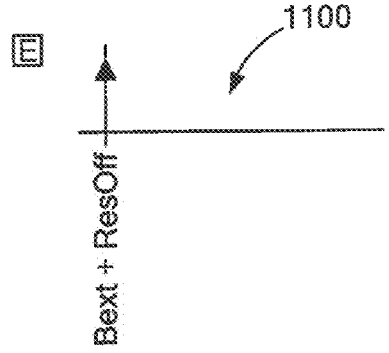

Referring now to FIG. 11 with reference to the signals of FIG. 10, a graph 1100 has a horizontal axis with a scale in arbitrary units of frequency and a vertical axis with a scale in arbitrary units of magnitude. The graph 1100 includes one spectral line when in the presence of a stationary, i.e. non-varying, magnetic field. The magnetic field is a sensed or external magnetic field.

The graph 1100 is representative of the magnetic field signal at a box labeled F of the magnetic field sensor 500 of FIG. 5.

As can be seen, by operation of the filter circuits 512, 514 of FIG. 5, some spectral components of FIG. 10 have been removed, leaving only the a spectral line at DC having a magnitude corresponding to the magnitude, Bext, of the external, or sensed, magnetic field plus the undesirable residual offset voltage, ResOff, (after chopping) generated by the magnetic field sensing element 501 of FIG. 5. The spectral line of FIG. 11 is representative of a measured-magnetic-field-responsive signal.

Figure 12:
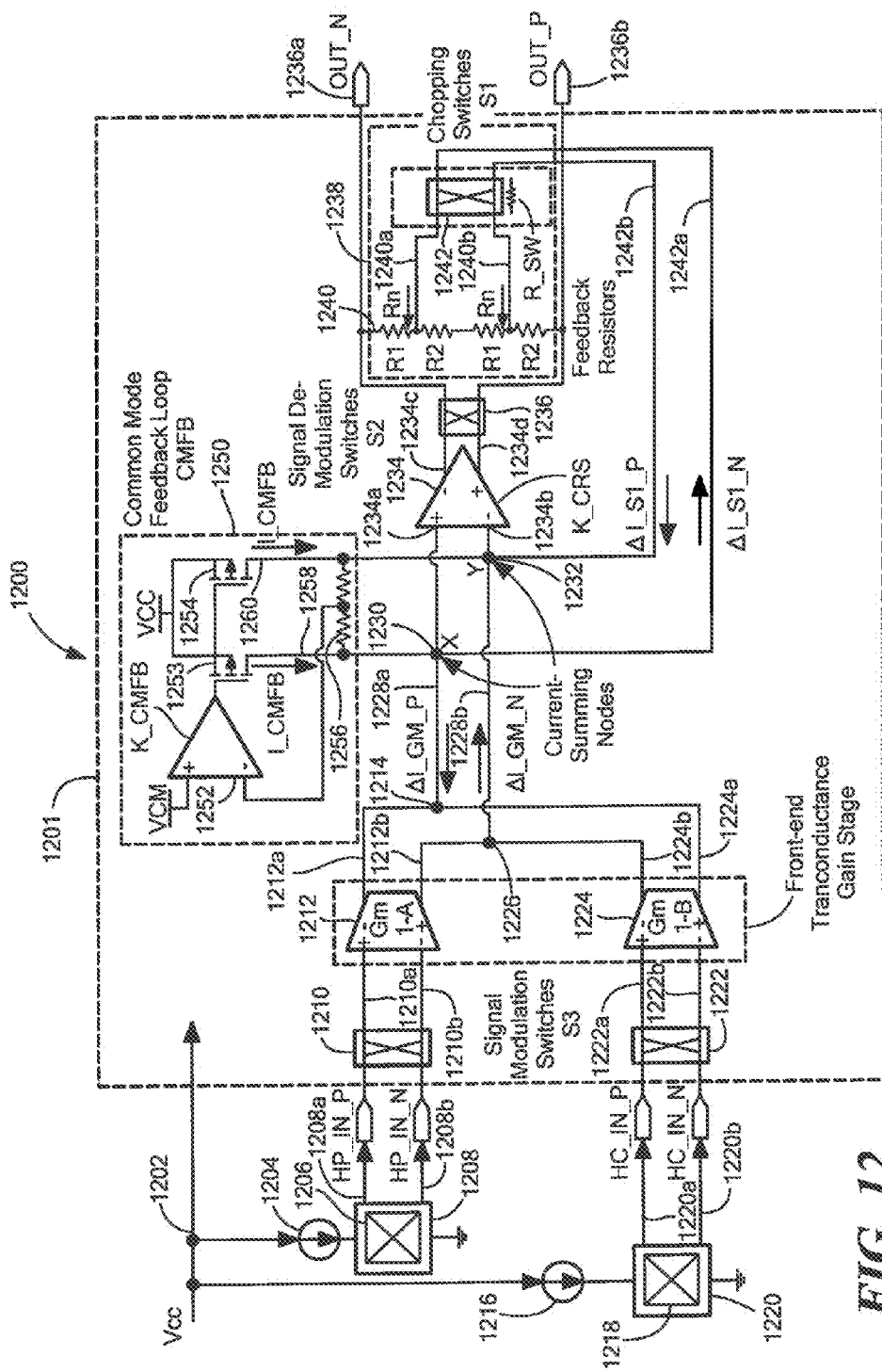
FIG. 12 is a block diagram showing an example of a prior art electronic amplifier, which can be used in the magnetic field sensor of FIG. 5.
Figure 13:
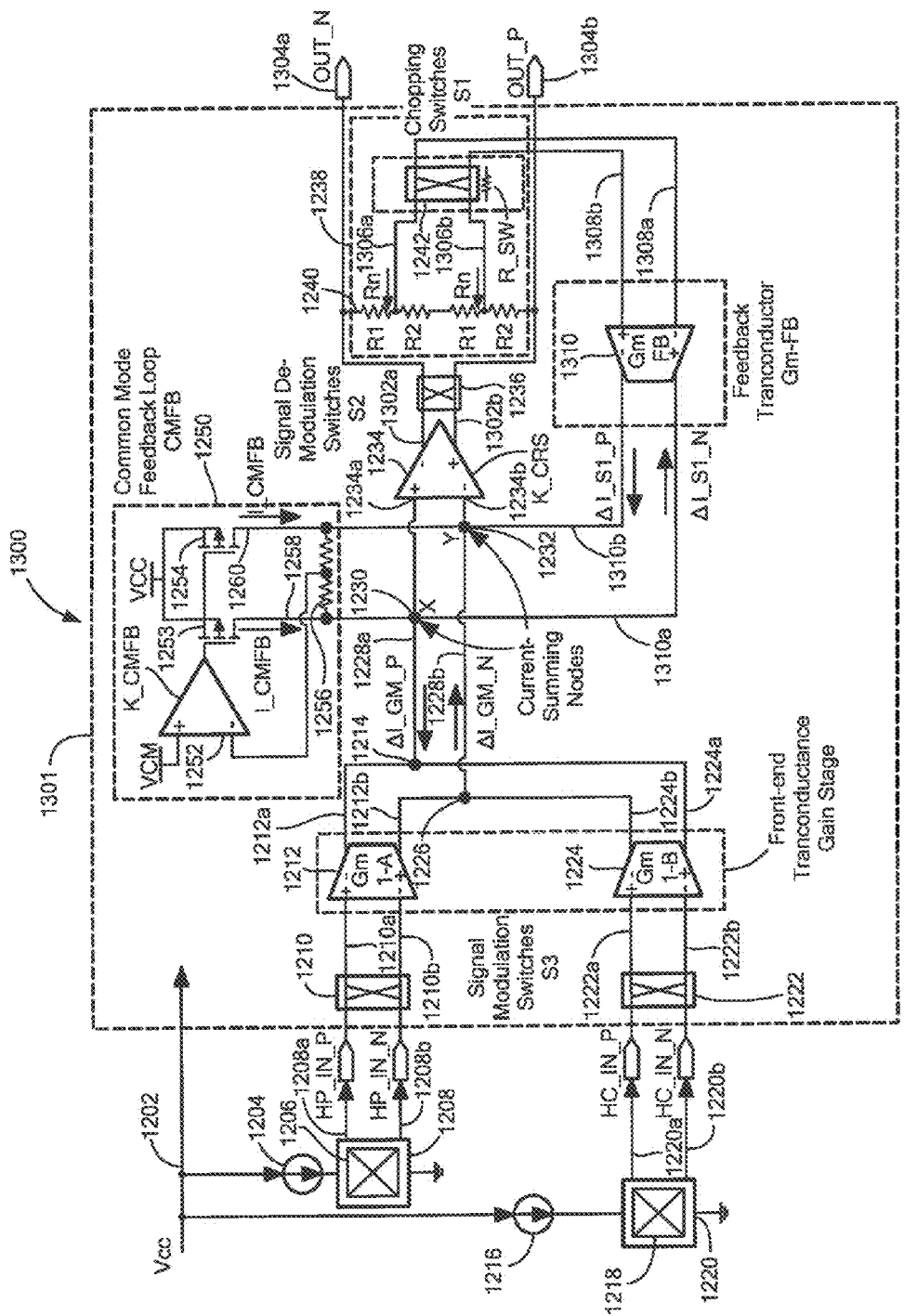
FIG. 13 is a block diagram showing an example of a different electronic amplifier, which can be used in the magnetic field sensor of FIG. 5 to provide improved results.

FIGS. 12 and 13 show electronic amplifiers that can be like a circuit portion 516 of FIG. 5. Electronic amplifier circuits shown below have two Hall effect elements. It should be understood that similar electronic amplifier circuits can have one Hall effect element, like the magnetic field sensor 500 of FIG. 5.

It should be understood that circuits shown below can include other circuit elements to provide a magnetic field sensor. For example, circuits shown below can include the filter 510, the filter 512, and/or the comparator 514.

Referring now to FIG. 12, an electronic amplifier circuit 1200 is here shown to include an electronic amplifier 1201 coupled to first and second Hall effect elements 1206, 1218. However, the electronic amplifier 1201 can equally well be coupled to other circuit elements instead. The electronic amplifier 1201 can be like the circuit portion 516 of FIG. 5, but showing further details.

In some embodiments, the first Hall effect element 1206 can be coupled to a switching circuit 1208 to provide current spinning (also referred to as chopping) of the first Hall effect element 1206. Similarly, the second Hall effect element 1218 can be coupled to a switching circuit 1220 to provide current spinning of the second Hall effect element 1218.

The current spinning provided by the switches 1206, 1220 can provide a so-called offset modulation associated with the first and second Hall effect elements 206, 1218. With offset modulation, the first and second Hall effect elements generate modulated differential voltage signals 1208a, 1208b, and 1220a, 1220b, respectively, with particular signal components in the frequency domain. The signal components are described in conjunction with FIG. 7. From FIG. 7, it should be understood that the modulated differential voltage signals 1208a, 1208b, and 1220a, 1220b contain a baseband signal component that represents a magnetic field sensed by the first and second Hall effect elements 1206, 1218. On the other hand, undesirable offset signal components have been shifted to a higher frequency by operation of the switching circuits 1208, 1220.

Current sources 1204, 1216 can be coupled to the switching circuits 1208, 1220 respectively to drive currents into the Hall effect elements 1206, 1218, respectively.

The modulated differential voltage signal 1208a, 1208b can be received by a switching circuit 1210. The switching circuit 1210 can be configured to generate a differential switched voltage signal 1210a, 1210b. A transconductance amplifier 1212 can be coupled to receive the differential switched voltage signal 1210a, 1210b and configured to generate a differential current signal 1212a, 1212b.

The modulated differential voltage signal 1220a, 1220b can be received by a switching circuit 1222. The switching circuit 1222 can be configured to generate a differential switched voltage signal 1222a, 1222b. A transconductance amplifier 1224 can be coupled to receive the differential switched voltage signal 1222a, 1222b and configured to generate a differential current signal 1224a, 1224b.

The differential current signal 1212a, 1212b can be coupled together with the differential current signal 1224a, 1224b at nodes 1214, 1226, to result in current signals 1228a, 1228b at a first summing node 1230 and at a second summing node 1232.

A voltage amplifier 1234 can have first and second input nodes 1234a, 1234b coupled to the first and second the summing nodes 1230, 1232, respectively. The voltage amplifier 1234 can be configured to generate a differential output voltage signal 1234c, 1234d.

The voltage amplifier 1234, by itself, can be an open loop amplifier having an open loop gain of at least 1000.

A switching circuit 1236 can be coupled to receive the differential output voltage signal 1234c, 1234d and operable to generate a switched differential signal 1236a, 1236b.

A sensing circuit 1238 can be coupled to the switched differential signal 1236a, 1236b, and operable to generate a differential feedback current signal 1242a, 1242b. The differential feedback current signal 1242a, 1242b can be coupled to the first and second summing nodes 1230, 1232, respectively, in a feedback arrangement.

The sensing circuit 1238 can include a resistor network 1240 coupled between the switched differential signal 1236a, 1236b. The resistor network 1240 can be configured to generate a differential output signal 1240a, 1240b, which can be a scaled-down version of the switched differential signal 1236a, 1236b.1

A switching circuit 1242 can be coupled to the differential output signal 1240a, 1240b and can be operable to generate the feedback current signal 1242a, 1242b.

It should be recognized that the switching circuit 1242 can be an active circuit component, and thus, can be coupled to receive a power supply voltage (not shown). A resistance of the switching circuit 1242 can vary in accordance with changes of the power supply voltage, therefore, for reasons described above in conjunction with FIGS. 3-6, a gain of the electronic amplifier circuit 1200 can vary in accordance with variations of the resistance of the switching circuit 1242. This behavior can be undesirable.

A common mode feedback circuit 1250 can be used to sense, via resistors 1256, and to correct, via current signals 1258, 1260, a common mode voltage at the summing nodes 1230, 1232 in accordance with a common mode reference voltage, VCM, received by an amplifier 1252, which is coupled to a current mirror 1253, 1254. Further details of the common mode feedback circuit 1250 are not described herein.

The overall effect of a switch resistance, $R_{sw}$, of the switching circuit 1242 on the gain of the electronic amplifier circuit 1200 can be represented as:

$$\text{Gain} \propto Gm_{in} * R_{feedback} \quad (4)$$

where:

$$R_{feedback} = R_n + R_{sw} \quad (5)$$

and where: $R_n$ is an equivalent impedance of a parallel combination of feedback resistors R1 and R2 of the sensing circuit 1238, given by:

$$R_n = R_1 R_2 / (R_1 + R_2) \quad (6)$$

For typical fabrication process ranges, $\Delta R_{sw}$ changes by about 180 Ohm from 3 V to 5.5 V power supply voltage variation. In a specific non-limiting example, $R_n$ is 10.6 kOhm. Thus, $\Delta R_{sw}$ of one hundred eighty Ohms will cause a gain change of $$\Delta R_{sw}/R_{feedback} = 0.0169 => 1.69\% \quad (7)$$

In operation, as the resistance of the switching circuit 1242 changes undesirably, there exists a difference in voltage across the switching circuit, which is proportional to the feedback currents 1242b and 1242a taken individually at different switched configurations, times the resistance of the switching circuit 1242. Since the resistance of the switching circuit 1242 changes undesirably, so too do the voltage differences mentioned above. Since the amplifier 1234 is connected in a negative feedback arrangement, in order to maintain the summing currents 1242a and 1242b, the differential voltage signal 1236a, 1236b changes undesirable in proportion to the undesirable change in resistance of the switching circuit 1242.

Referring now to FIG. 13 in which like elements of FIG. 12 are shown having like reference designations, an electronic amplifier circuit 1300 can be similar to the electronic amplifier circuit 1200 of FIG. 12. However, a transconductance amplifier 1310 has been added in the feedback loop in series with the sensing circuit 1238. As with the other transconductance amplifiers, the transconductance amplifier 1310 can have a high input impedance and also high output impedance.

The electronic amplifier circuit 1300 is here shown to include an electronic amplifier 1301 coupled to first and second Hall effect elements 1206, 1218. However, the electronic amplifier 1301 can equally well be coupled to other circuit elements instead.

The electronic amplifier 1301 can be like the circuit portion 516 of FIG. 5, but showing further details.

In the same way as described above in conjunction with FIG. 3, it will be understood that the dependency upon the variation of the resistance of the switching circuit 1242 (due, for example, to power supply voltage changes) is removed in the electronic amplifier circuit 1300, compared to the electronic amplifier circuit 1200 of FIG. 12. Essentially zero current flows through the resistance of the switching circuit 1242, thereby generating no voltage across the switching circuit 1242. Thus, the electronic amplifier does not suffer the same variation of gain as the electronic amplifier circuit 1200 of FIG. 12.

The electronic amplifier circuit 1300 can have a better power supply rejection ratio (PSRR) than the electronic amplifier circuit 1200. Simulated results are described below in conjunction with FIGS. 14 and 15.

As described above in conjunction with FIG. 3, using the transconductance amplifier 1310 in the feedback loop causes a gain of the electronic amplifier circuit 1300 to be independent of variations of resistance of the switching circuit 1242. A gain of the electronic amplifier 1301 can be determined as:

$$\text{Gain} \propto Gm_{in} * 1/Gm_{fb} * U_{feedback} \quad (8)$$

where:

$$U_{feedback} * (R_1 + R_2)/R_2 \quad (9)$$

Figure 14:
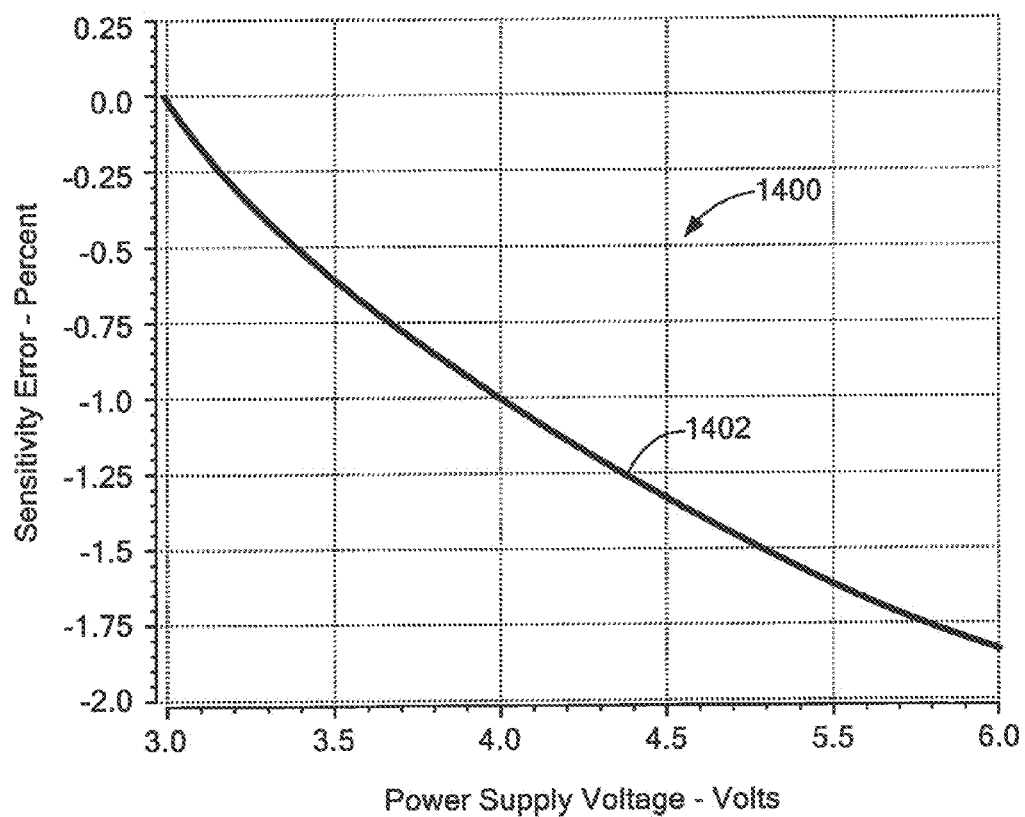
FIG. 14 is a graph showing a simulated prior art relationship between a sensitivity error versus a power supply voltage of the magnetic field sensor of FIG. 5 having an electronic amplifier as shown in FIG. 12.

Referring now to FIG. 14, a graph 1400 has a horizontal axis with a scale in units of power supply voltage in volts (to the switching circuit 1242 of FIG. 12). The graph 1400 has a vertical axis with a scale in units of sensitivity error (i.e., gain error, i.e., ratiometry error) in percent. In accordance with equation (7) above, and in accordance with an electronic amplifier 1201, a simulated curve 1402 indicates that the gain of the prior art electronic amplifier 1201 of FIG. 12 varies by about 1.69 percent from 3 V to 5.5 V.

The variation of the sensitivity (i.e., gain) with respect to power supply voltage shown in the simulated curve 1402 is indicative of a relatively high ratiometry error. It should also be understood, however, that the ratiometry error of the electronic amplifier 1201 can be different from time to time, at other temperatures, or from unit to unit. Thus, the ratiometry error may not be consistent.

Figure 15:
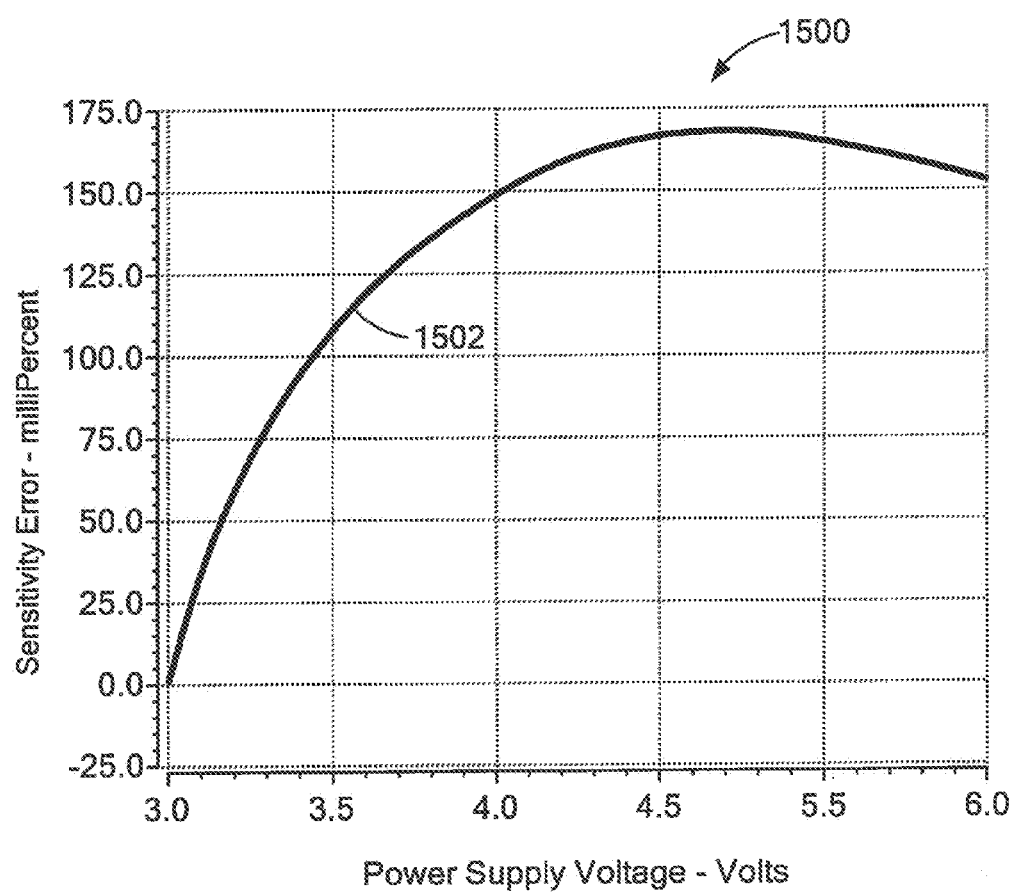
FIG. 15 is a graph showing an improved simulated relationship between a sensitivity error versus a power supply voltage of the magnetic field sensor of FIG. 5 having an electronic amplifier as shown in FIG. 13.

Referring now to FIG. 15, a graph 1500 has a horizontal axis with a scale in units of power supply voltage in volts (to the switching circuit 1242 of FIG. 13). The graph 1500 has a vertical axis with a scale in units of sensitivity error (i.e., gain error, i.e., ratiometry error) in percent. A simulated curve 1502 indicates that the gain of the electronic amplifier 1301 of FIG. 13 varies by about 0.17 percent from 3 V to 5.5 V. Thus, the DC power supply rejection ratio (PSRR) of the electronic amplifier 1301 can be greater than 40 dB (or as much as about 55 dB for a gain change of 0.17 percent), where PSRR=20 log (1/(gain change)).

The variation of the sensitivity (i.e., gain) with respect to power supply voltage shown in the simulated curve 1502 is indicative of a relatively low ratiometry error.

It should be understood that the low ratiometry error is achieved even without using a voltage regulator to power the switching circuit 1242. Thus, silicon real estate area can be reduced. Since voltage regulators tend to use power, power consumption can also be reduced.

It is described above in conjunction with FIGS. 3, 4, and 13, that electronic amplifiers 300, 400, 1300 can have a low ratiometry error and low ratiometry. In conjunction with FIG. 16, another electronic amplifier circuit can make use of the low ratiometry error and low ratiometry to introduce a known and consistent ratiometry error and ratiometry.

Figure 16:
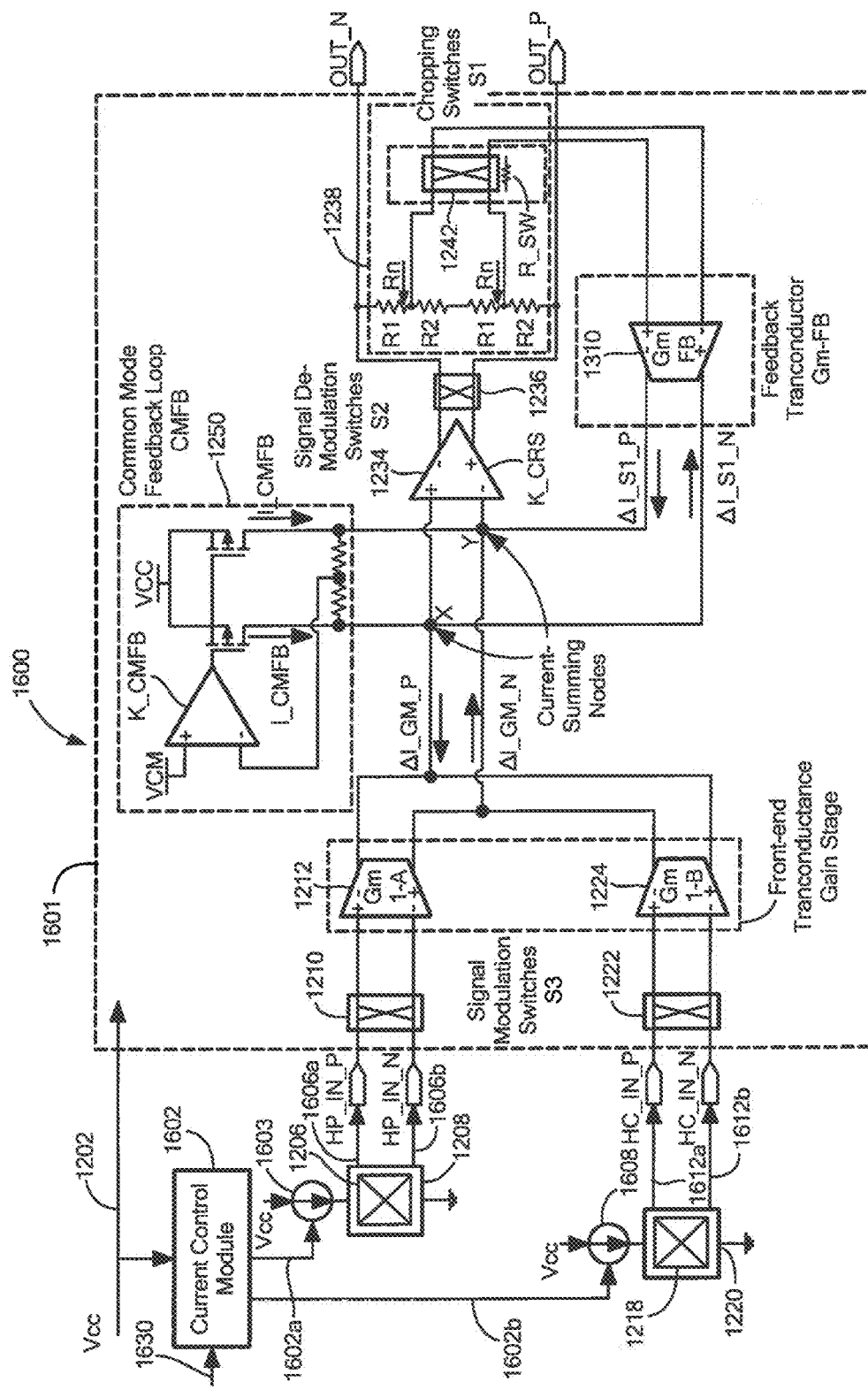
FIG. 16 is a block diagram showing an example of a different electronic amplifier, which can be used in the magnetic field sensor of FIG. 5 to provide improved results different than the results provided by the electronic amplifier of FIG. 13.

Referring now to FIG. 16, in which like elements of FIGS. 12 and 13 are shown having like reference designators, an electronic amplifier circuit 1600 has an electronic amplifier 1601 that can be the same as or similar to the electronic amplifier 1301 of FIG. 13. Thus, the electronic amplifier 1601 maintains the same low ratiometry error as the electronic amplifier 1301 of FIG. 13 and as represented by the simulated curve 1502 of FIG. 15.

Current sources 1603, 1608 can be coupled to the switching circuit 1208, 1220 respectively, to drive currents into the Hall effect elements 1206, 1218, respectively.

In some embodiments, the current sources 1603, 1608 can have control nodes coupled to receive control signals 1602a, 1602b from a current control module 1602. The current control module 1602 can also be coupled to receive a power supply voltage 1202, which can be the same power supply voltage that powers the switching circuit 1242. Sensitivity of the Hall effect element 1604, 1610 tends to be directly influenced by currents generated by the current sources 1603, 6010, respectively.

In operation, the current control module 1602 can control the currents generated by the current sources 1603, 1608 according to the power supply voltage 1202. Thus, the current control module 1602 can change the drive currents generated by the current sources 1603, 1608 in relation to the power supply voltage 1202. It should be recognized this arrangement can provide a consistent and known ratiometry, wherein a resulting sensitivity of the entire electronic amplifier circuit 1600 can vary in a known and consistent way with respect to the power supply voltage 1202.

In some optional embodiments, the current control module 1602 can be coupled to receive a control signal 1630. The control signal can program or otherwise change operation of the current control module 1602 to provide a known, predetermined, programmable, or otherwise different ratiometry relationship.

While it is shown that the current control module 1202 can be coupled to receive the power supply voltage 1202, and therefore provide a known ratiometry with respect to power supply voltage, in other embodiments, the current control module can be coupled to receive a different signal, for example, a temperature signal generated by a temperature sensor (not shown). For this embodiment, the ratiometry can be made with respect to temperature instead of, or in addition to, power supply voltage. Other ratiometries are also possible.

While electronic amplifiers 1301, 1601 of FIGS. 13 and 16 can have various differential signals, in other embodiments, similar electronic amplifiers can have single ended arrangements.

In view of the above, it should be understood that the present inventions, e.g., the electronic amplifier 1301 of FIG. 13, can achieve the following:
PSRR>40 dB
Input dynamic range, e.g., +/−200 A
No on-chip regulator required
Large supply voltage range. (2.8 V-5.5V)
Can provide ratiometric parts (know ratiometry) as well to achieve very tight, non-varying, ratiometry, e.g., FIG. 16.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An electronic amplifier circuit, comprising:
a voltage amplifier having a first input node and a voltage output node, wherein the first input node of the voltage amplifier is coupled to a first summing node, wherein the first summing node is coupled to receive a first input current signal;
a feedback circuit having an input node and a first output node, wherein the feedback circuit comprises:
a sensing circuit having an input node and an output node, wherein the input node of the sensing circuit, the input node of the feedback circuit, and the output node of the voltage amplifier are coupled together; and
a first transconductance amplifier having an input node and a first output node, wherein the output node of the sensing circuit is coupled to the input node of the first transconductance amplifier, wherein the first output node of the first transconductance amplifier, the first output node of the feedback circuit, and the first input node of the voltage amplifier are coupled together at the first summing node, wherein the first transconductance amplifier is operable to generate a first feedback current signal at the first summing node, wherein the first feedback current signal and the first input current signal are coupled together at the first summing node to provide a sum of the first input current signal and the first feedback current signal at the first summing node, wherein a value of an impedance of the output node of the sensing circuit varies with a value of a power supply voltage coupled to the sensing circuit, wherein the first feedback current signal is unaffected by the value of the power supply voltage.

2. The electronic amplifier circuit of claim 1, wherein the sensing circuit comprises a resistor divider coupled in series with an active circuit component, wherein the active circuit component is coupled to the output node of the sensing circuit, and wherein the value of the impedance of the output node of sensing circuit varies in accordance with a value of an impedance of the active circuit.

3. The electronic amplifier circuit of claim 1, further comprising a second transconductance amplifier having an input node and a first output node, the input node of the transconductance amplifier coupled to a first input voltage signal, wherein the second transconductance amplifier is operable to generate the first input current signal at the first output node of the second transconductance amplifier and coupled to the first summing node.

4. The electronic amplifier circuit of claim 3, further comprising a first modulator coupled between the first input voltage signal and the input node of the second transconductance amplifier, wherein the first input current signal at the first summing node comprises a first modulated current signal.

5. The electronic amplifier circuit of claim 4, further comprising a demodulator coupled between the output node of the voltage amplifier and the input node of the feedback circuit.

6. The electronic amplifier circuit of claim 3, further comprising:
a first Hall effect element coupled to generate the first input voltage signal; and
a first current source for driving a first drive current into the first Hall effect element.

7. The electronic amplifier circuit of claim 6, wherein the first current source comprises a control node coupled to receive a first current control signal for controlling the first drive current into the first Hall effect element.

8. The electronic amplifier circuit of claim 7, further comprising a control circuit for generating the first current control signal, wherein the control circuit is coupled to a power supply voltage and configured to control the first drive current into the first Hall effect element in a predetermined relationship with the power supply voltage.

9. The electronic amplifier circuit of claim 3, wherein the voltage amplifier further comprises a second input node, wherein the second input node of the voltage amplifier is coupled to a second summing node, wherein the second summing node is coupled to receive a second input current signal, wherein the second transconductance amplifier further comprises a second output node, wherein the second transconductance amplifier is operable to generate a second current signal at the second output node of the second transconductance amplifier and coupled to the second summing node.

10. The electronic amplifier circuit of claim 9, further comprising a third transconductance amplifier having an input node and first and second output nodes, the input node of the third transconductance amplifier coupled to a second input voltage signal and the third transconductance amplifier operable to generate a third current signal at the first output node of the third transconductance amplifier and a fourth current signal at the second output node of the third transconductance amplifier, the third current signal coupled to the first summing node and the fourth current signal coupled to the second summing node.

11. The electronic amplifier circuit of claim 9, wherein the feedback circuit further comprises a second output node, wherein the first transconductance amplifier further comprises a second output node, wherein the second output node of the feedback circuit, the second output node of the feedback circuit and the second input node of the voltage amplifier are coupled together to the second summing node.

12. The electronic amplifier circuit of claim 9, further comprising a second modulator coupled between the second input voltage signal and the input node of the third transconductance amplifier, wherein the second input current signal at the second summing node comprises a second modulated current signal.

13. The electronic amplifier circuit of claim 10, further comprising:
    a first Hall effect element coupled to generate the first input voltage signal; and
    a first current source for driving a first drive current into the first Hall effect element;
    a second Hall effect element coupled to generate the second input voltage signal; and
    a second current source for driving a second drive current into the second Hall effect element.

14. The electronic amplifier circuit of claim 13, wherein the first current source comprises a control node coupled to receive a first current control signal for controlling the first drive current into the first Hall effect element, and wherein the second current source comprises a control node coupled to receive a second current control signal for controlling the second drive current into the second Hall effect element.

15. The electronic amplifier circuit of claim 14, wherein the control circuit is operable to generate the first current control signal and the second current control signal, wherein the control circuit is coupled to a power supply voltage and configured to control the first drive current into the first Hall effect element in a predetermined relationship with the power supply voltage and configured to control the second drive current into the second Hall effect element in the predetermined relationship with the power supply voltage.

16. A method, comprising:
    receiving a first input current signal current signal at a first input node of a voltage amplifier, the voltage amplifier having a voltage output node, wherein the first input node of the voltage amplifier is coupled to a first summing node; and
    generating a first feedback current signal with a feedback circuit having an input node and a first output node, wherein the feedback circuit comprises:
        a sensing circuit having an input node and an output node, wherein the input node of the sensing circuit, the input node of the feedback circuit, and the output node of the voltage amplifier are coupled together; and
        a first transconductance amplifier having an input node and a first output node, wherein the output node of the sensing circuit is coupled to the input node of the first transconductance amplifier, wherein the first output node of the first transconductance amplifier, the first output node of the feedback circuit, and the first input node of the voltage amplifier are coupled together at the first summing node, wherein the first transconductance amplifier is operable to generate a first feedback current signal at the first summing node, wherein the first feedback current signal and the first input current signal are coupled together at the first summing node to provide a sum of the first input current signal and the first feedback current signal at the first summing node, wherein a value of an impedance of the output node of the sensing circuit varies with a value of a power supply voltage coupled to the sensing circuit, wherein the first feedback current signal is unaffected by the value of the power supply voltage.

17. The method of claim 16, wherein the sensing circuit comprises a resistor divider coupled in series with an active circuit component, wherein the active circuit component is coupled to the output node of the sensing circuit, and wherein the value of the impedance of the output node of sensing circuit varies in accordance with a value of an impedance of the active circuit.

18. The method of claim 16, further comprising generating the first input current signal with a second transconductance amplifier having an input node and a first output node, the input node of the transconductance amplifier coupled to a first input voltage signal.

19. The method of claim 18, wherein the generating the first current signal comprises:
    generating the first current input signal in accordance with a first Hall effect element coupled to generate the first input voltage signal; and
    driving a first drive current into the first Hall effect element with a first current source.

20. The method of claim 19, wherein the first current source comprises a control node coupled to receive a first current control signal for controlling the first drive current into the first Hall effect element.

21. The method of claim 20, further comprising generating the first current control signal with a control circuit, wherein the control circuit is coupled to a power supply voltage and configured to control the first drive current into the first Hall effect element in a predetermined relationship with the power supply voltage.

22. The method of claim 18, further comprising:
    receiving a second input current signal current signal at a second input node of the voltage amplifier, wherein the second input node of the voltage amplifier is coupled to a second summing node;
    wherein the second transconductance amplifier further comprises a second output node, wherein the second transconductance amplifier is operable to generate a second current signal at the second output node of the second transconductance amplifier and coupled to the second summing node.

23. The method of claim 22, further comprising generating the second input current signal with a third transconductance amplifier having an input node and first and second output nodes, the input node of the third transconductance amplifier coupled to a second input voltage signal and the third transconductance amplifier operable to generate a third current signal at the first output node of the third transconductance amplifier and a fourth current signal at the second output node of the third transconductance amplifier, the third current signal coupled to the first summing node and the fourth current signal coupled to the second summing node.

24. The method of claim 22, wherein the feedback circuit further comprises a second output node, wherein the first transconductance amplifier further comprises a second output node, wherein the second output node of the feedback circuit, the second output node of the feedback circuit and the second input node of the voltage amplifier are coupled together to the second summing node.

25. The method of claim 22, wherein the generating the first current signal comprises:
    generating the first current input signal in accordance with a first Hall effect element coupled to generate the first input voltage signal; and driving a first drive current into the first Hall effect element with a first current source, wherein the generating the second current signal comprises:

generating the second current input signal in accordance with a second Hall effect element; and driving a second drive current into the second Hall effect element with a second current source.

26. The method of claim 25, wherein the first current source comprises a control node coupled to receive a first current control signal for controlling the first drive current into the first Hall effect element, and wherein the second current source comprises a control node coupled to receive a second current control signal for controlling the second drive current into the second Hall effect element.

27. The method of claim 26, further comprising:

generating the first current control signal and the second current control signal with the control circuit, wherein the control circuit is coupled to a power supply voltage and configured to control the first drive current into the first Hall effect element in a predetermined relationship with the power supply voltage and configured to control the second drive current into the second Hall effect element in the predetermined relationship with the power supply voltage.

\* \* \* \* \*

UNITED STATES PATENT AND TRADEMARK OFFICE
CERTIFICATE OF CORRECTION

PATENT NO. : 9,698,742 B2
APPLICATION NO. : 14/876210
DATED : July 4, 2017
INVENTOR(S) : Virag Chaware et al.

It is certified that error appears in the above-identified patent and that said Letters Patent is hereby corrected as shown below:

On the Title Page

Item (71), delete "Allegro Microsystems, LLC" and replace with --Allegro MicroSystems, LLC--.

Item (73), delete "Allegro Microsystems, LLC" and replace with --Allegro MicroSystems, LLC--.

In the Specification

Column 1, Line 26, delete "an otherwise an" and replace with --otherwise an--.

Column 1, Line 39, delete "use and active" and replace with --use an active--.

Column 3, Line 61, delete "element In particular," and replace with --element. In particular,--.

Column 5, Lines 39-40, delete "the current signal current signal 104$d$." and replace with --the current signal 104$d$.--.

Column 8, Line 26, delete "sin c" and replace with --sinc--.

Column 8, Line 33, delete "sin c" and replace with --sinc--.

Column 8, Line 35, delete "sin c" and replace with --sinc--.

Column 8, Line 38, delete "that clock" and replace with --that the clock--.

Column 8, Line 39, delete "sin c" and replace with --sinc--.

Column 8, Line 41, "sin c" and replace with --sinc--.

Column 8, Line 58, delete "with sales in units" and replace with --with scales in units--.

Signed and Sealed this
Eighth Day of January, 2019

Andrei Iancu
*Director of the United States Patent and Trademark Office*

CERTIFICATE OF CORRECTION (continued)
U.S. Pat. No. 9,698,742 B2

Column 10, Line 64, delete "the a spectral" and replace with --a spectral--.

Column 11, Line 30, delete "elements 206, 1218." and replace with --1206, 1218.--.

Column 12, Line 19, delete "1236$a$, 1236$b$.1" and replace with --1236$a$, 1236$b$.--.

Column 13, Eq. (9), delete "$U_{feedback}*(R_1+R_2)/R_2$" and replace with --$U_{feedback}=(R_1+R_2)/R_2$--.